(12) United States Patent
Fujita et al.

(10) Patent No.: US 8,174,229 B2
(45) Date of Patent: May 8, 2012

(54) SAMPLE STAGE APPARATUS AND METHOD OF CONTROLLING THE SAME

(75) Inventors: Masashi Fujita, Hitachinaka (JP); Shuichi Nakagawa, Hitachinaka (JP); Takashi Kobayashi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 505 days.

(21) Appl. No.: 12/420,358

(22) Filed: Apr. 8, 2009

(65) Prior Publication Data

US 2009/0251091 A1    Oct. 8, 2009

(30) Foreign Application Priority Data

Apr. 8, 2008 (JP) ................................. 2008-100654

(51) Int. Cl.
*B64C 17/06* (2006.01)
(52) U.S. Cl. .......................... 318/649; 318/594; 318/650
(58) Field of Classification Search .................. 318/649, 318/594, 650, 652
See application file for complete search history.

(56) References Cited

U.S. PATENT DOCUMENTS 7,435,974 B2   10/2008   Matsushima
2010/0199623 A1*   8/2010   Akahane ........................ 56/11.4

FOREIGN PATENT DOCUMENTS

JP    2007-080660    3/2007

* cited by examiner

*Primary Examiner* — Karen Masih
(74) *Attorney, Agent, or Firm* — McDermott Will & Emery LLP (57) ABSTRACT

The present invention provides a stage apparatus capable of reducing a positioning time without increasing a positional deviation. A positioning control method of a sample stage apparatus includes: a high-speed movement step of moving a table to a high-speed movement target position at a first movement speed; a positional deviation correcting step of moving the table to a low-speed positioning step start position at a second movement speed that is lower than the first movement speed; a low-speed positioning step of moving the table to a target position at a third movement speed that is lower than the second movement speed. After the low-speed positioning step is completed, a rod connected to a motor returns to its original position to separate a pin of the rod side from a concave portion of the table side.

17 Claims, 5 Drawing Sheets

SAMPLE STAGE APPARATUS AND METHOD OF CONTROLLING THE SAME

BACKGROUND OF THE INVENTION

1. Field of the Invention

The present invention relates to a sample stage that holds a sample, and more particularly, to a positioning technique of a sample stage apparatus including X and Y tables.

2. Description of the Related Art

Precision machines and test apparatuses use sample stages that hold samples. The sample stage requires high-speed movement and high-accuracy positioning. An example of an apparatus using the sample stage is an electron microscope.

Japanese Patent Application Laid-Open (JP-A) No. 2007-80660 (corresponding to U.S. Pat. No. 7,435,974) discloses a stage that has a driving mechanism including a stepping motor and a feed screw and performs open-loop control to achieve high-speed and high-accuracy positioning. In the driving mechanism, a gap is provided in a connection portion between a table of the stage and the feed screw in order to prevent the movement of the stage due to the thermal expansion of the feed screw. In this way, the feed screw and the table are mechanically connected to or separated from each other.

As a positioning control method of correcting a positional deviation, the following method has been proposed: a method of dividing the movement of a table into two steps and performs two processes, that is, a high-speed movement process and a low-speed movement process. The low-speed movement process stops the driving of the table at a designated position while monitoring the position of the stage using a position detector. In this way, it is possible to correct the positional deviation and achieve high-accuracy positioning.

However, in the stage positioning control disclosed in JP-A No. 2007-80660, after the high-speed movement process is performed, the table is moved by inertial force due to the gap formed in the stage connection portion, and a positional deviation occurs. The positional deviation occurring after the high-speed movement process is affected by the movement conditions of the table(for example, the inertia, the movement distance, and the movement speed of the table) or brake force. Therefore, in the case of an apparatus including a plurality of tables with different axes, the positional deviations of the tables are different from each other, and a difference in positional deviation occurs whenever the tables are moved.

That is, during the low-speed movement process performed after the high-speed movement process, a movement distance varies all the time. Therefore, the following two problems arise. (1) In the case of a stage apparatus including a plurality of tables with different axes, although the positioning of one of the tables is completed, the positioning of the other table is not completed yet, which results in a waste time for positioning. (2) A plurality of tables with different axes are not completely positioned at the same time. Therefore, when one of the tables is moved and the positioning of the other table is completed, a positional deviation occurs in the other table that has been completely positioned due to the inertia of the one table being moved.

The waste time for positioning and the positional deviation may further increase due to an increase in the speed of the table and an increase in inertia as growing the size of the table.

SUMMARY OF THE INVENTION

An object of the present invention is to provide a stage apparatus capable of reducing a waste time for positioning, which occurs when a positional deviation increase, and performing high-accuracy positioning.

According to the present invention, a positioning control method of a sample stage apparatus includes: a high-speed movement process of moving a table to a high-speed movement target position at a first movement speed; a positional deviation correcting process of moving the table to a low-speed positioning step start position at a second movement speed that is lower than the first movement speed; a low-speed positioning step of moving the table to a target position at a third movement speed that is lower than the second movement speed. After the low-speed positioning process is completed, a rod connected to a motor returns to its original position to separate a pin of the rod from a concave portion of the table side.

According to the present invention, it is possible to reduce a waste time for positioning, which occurs when a positional deviation increases, and perform high-accuracy positioning.

DESCRIPTION OF THE PREFERRED EMBODIMENTS

Hereinafter, a positioning control technique of a sample stage apparatus according to the present invention will be described in detail with reference to the accompanying drawings.

Figure 1A:
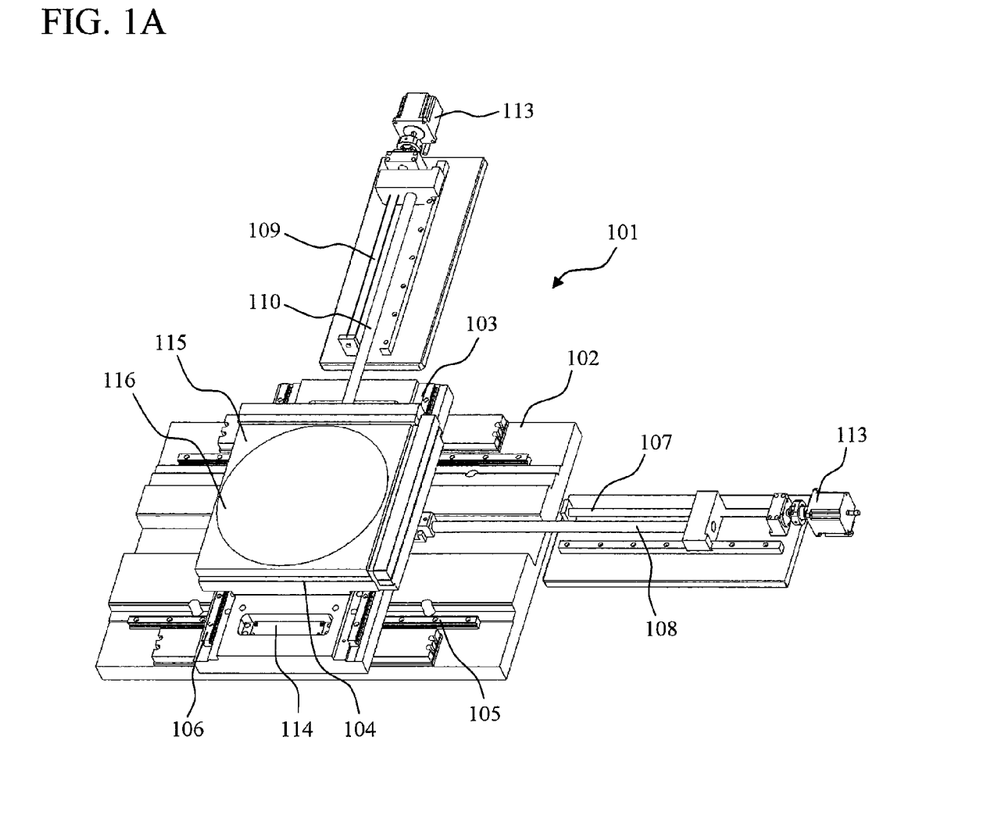
FIG. 1A is a diagram illustrating an example of the structure of a sample stage apparatus according to the present invention.

FIG. 1A is a diagram illustrating an example of the sample stage apparatus according to the present invention. A sample stage apparatus 101 includes X and Y tables that are driven by stepping motors. The sample stage apparatus 101 includes a base 102, an X table 103, and a Y table 104. The X table 103 can be moved in an X direction by an X-direction guide mechanism 105, and the Y table 104 can be moved in a Y direction by a Y-direction guide mechanism 106. The X table 103 and the Y table 104 are independently moved.

A driving mechanism of the X table 103 includes an X ball screw 107, an X rod 108, and a stepping motor 113. When the X ball screw 107 is rotated by the stepping motor 113, the X rod 108 is moved in a straight line to press the X table 103 in the X direction. Similarly, a driving mechanism of the Y table 104 includes a Y ball screw 109, a Y rod 110, and a stepping motor 113. When the Y ball screw 109 is rotated by the stepping motor 113, the Y rod 110 is moved in a straight line to press the Y table 104 in the Y direction.

Active brakes 114 are attached to the X table 103 and the Y table 104 respectively. A piezoelectric element is provided in each of the active brakes 114. It is possible to control brake force by adjusting a voltage applied to the piezoelectric element.

When the table is moved at a relatively high speed, the inertial force thereof is relatively large. Therefore, even when the stepping motor 113 stops and the active brake 114 is turned on, the table does not stop immediately, but stops after it is moved a predetermined distance. On the other hand, when the table is moved at a relatively low speed, the inertial force thereof is relatively small. Therefore, immediately after the stepping motor 113 stops and the active brake 114 is turned on, the table stops.

In this embodiment, only the active brake 114 attached to the X table 103 is shown, but the active brake 114 attached to the Y table 104 is not shown.

A sample holder 115 is mounted on the Y table 104, and a sample 116 is fixed to the sample holder 115. In this embodiment, the sample 116 is a semiconductor wafer. The sample stage apparatus according to the present invention can be used for an electron microscope. However, the sample stage apparatus may be used for precision machines other than the electron microscope.

Figure 1B:
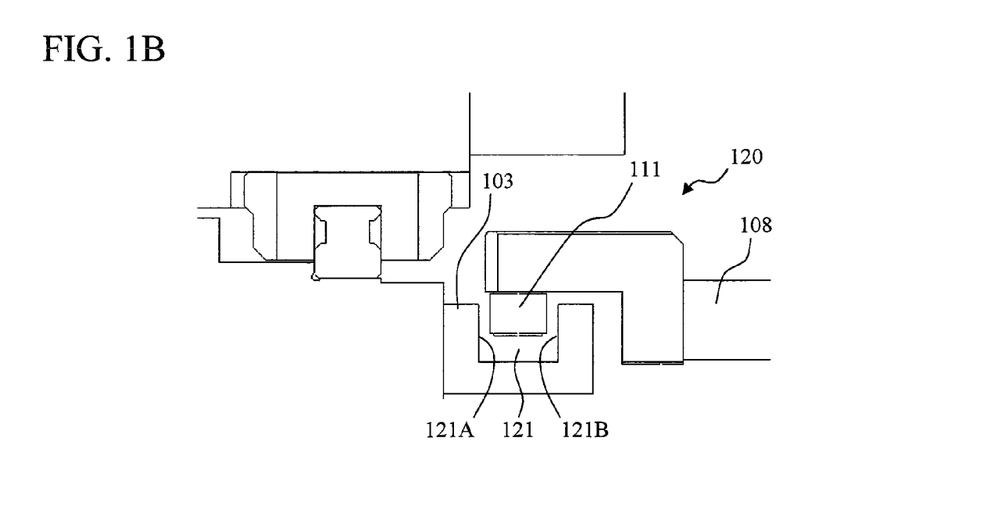
FIG. 1B is a diagram illustrating the structure of a connection portion between an X rod and an X table in the sample stage apparatus according to the present invention.

The structure of a connection portion 120 between the X rod 108 and the X table 103 will be described with reference to FIG. 1B. A pin 111 is attached to the leading end of the X rod 108. A concave portion 121 is provided in the X table 103. The pin 111 of the X rod 108 is inserted into the concave portion 121 of the X table 103. The outside diameter of the pin 111 is referred to as d, and the inside diameter of the concave portion 121 is referred to as D. In this embodiment, the following relationship is established: D−d=50 μm. Therefore, the distance between the outer surface of the pin 111 and the inner surface of the concave portion 121, that is, a gap therebetween is 25 μm.

Figure 2A:
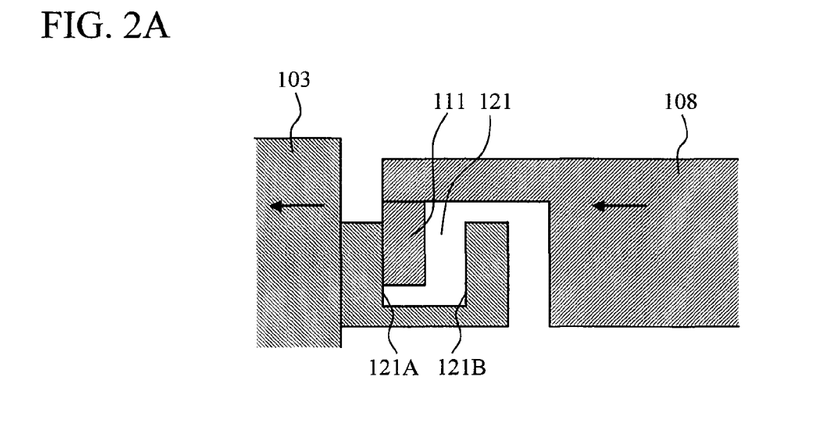
FIGS. 2A, 2B, and 2C are diagrams illustrating the operation of the X rod moving the X table in the sample stage apparatus according to the present invention.
Figure 2B:
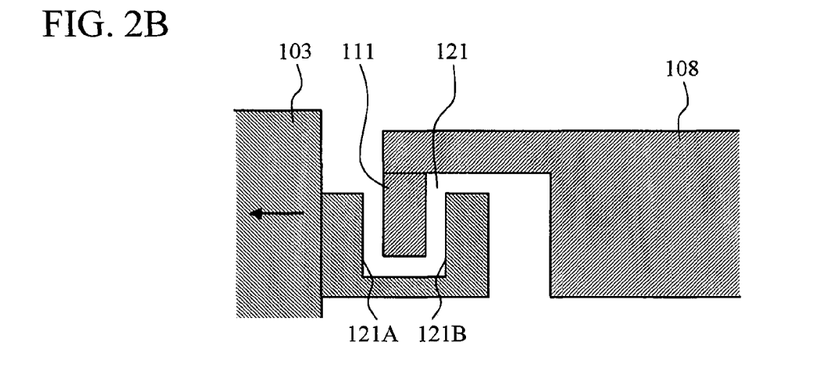
Figure 2C:
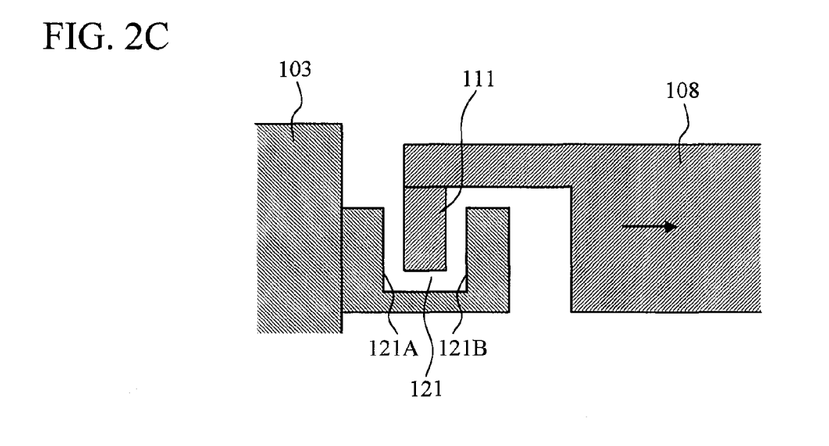

The operation of the X rod 108 moving the X table 103 will be described with reference to FIGS. 2A, 2B, and 2C. As shown in FIG. 2A, both the X rod 108 and the X table 103 are moved in a direction that is represented by an arrow. In this case, the pin 111 comes into contact with a front inner surface 121A of the concave portion 121 of the X table 103. It is assumed that the stepping motor 113 stops, and the X rod 108 stops in the state shown in FIG. 2A. When the table is moved at a relatively high speed, the inertial force thereof is relatively large. Therefore, even when the X rod 108 stops and the active brake 114 is turned on, the table does not stop immediately. As shown in FIG. 2B, the X table 103 stops after it is moved a predetermined distance. Therefore, the pin 111 is separated from the front inner surface 121A of the concave portion 121 of the X table 103.

On the other hand, when the table is moved at a relatively low speed, the inertial force thereof is relatively small. Therefore, immediately after the X rod 108 stops and the active brake 114 is turned on, the table stops. As shown in FIG. 2A, the pin 111 comes into contact with the front inner surface 121A of the concave portion 121 of the X table 103. Then, the X rod 108 is moved in the opposite direction. As shown in FIG. 2C, the pin 111 is separated from the front inner surface 121A of the concave portion 121 of the X table 103. Since the X rod 108 and the X table 103 are separated from each other, the thermal deformation and vibration of the screw 107 are not transmitted from the X rod 108 to the X table 103.

According to the present invention, the position of the table is determined by three processes, that is, a high-speed movement process, a positional deviation correcting process, and a low-speed positioning process. During the final low-speed positioning process, the movement speed of the table is sufficiently low, and the inertial force thereof is sufficiently small. When the stepping motor 113 stops, the table stops immediately by the operation of the active brake 114. Therefore, as shown in FIG. 2A, when the table stops, the pin 111 comes into contact with the front inner surface 121A of the concave portion 121 of the X table 103. Then, the X rod 108 is moved in the opposite direction. In this way, as shown in FIG. 2C, the pin 111 is separated from the front inner surface 121A of the concave portion 121 of the X table 103. In this case, the gap between the pin 111 and each of the inner surfaces 121A and 121B of the concave portion 121 is 25 μm.

In this embodiment, the connection portion between the X rod 108 and the X table 103 has been described above. A connection portion between the Y rod 110 and the Y table 104 has the same structure as the connection portion.

Figure 3:
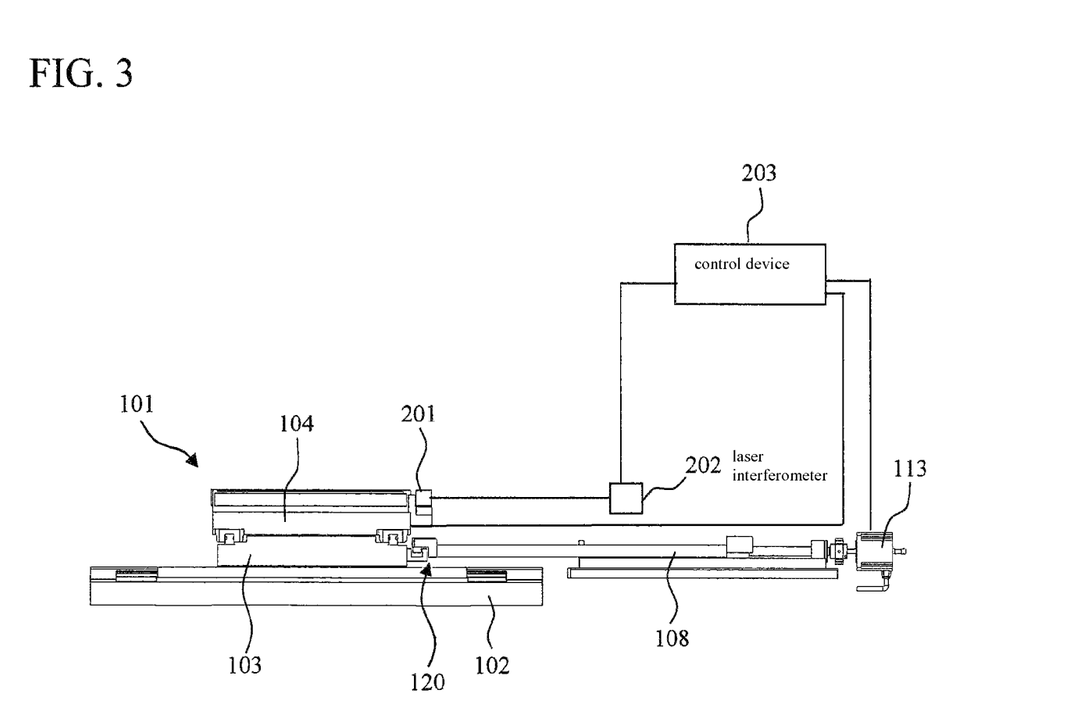
FIG. 3 is a diagram illustrating an example of a positioning control mechanism of the sample stage apparatus according to the present invention.

An example of the positioning control mechanism of the sample stage apparatus according to the present invention will be described with reference to FIG. 3. The sample stage apparatus 101 includes the base 102, the X table 103, and the Y table 104. The X rod 108 is connected to the X table 103 through the connection portion 120. The X rod 108 is driven by the stepping motor 113.

According to this embodiment of the present invention, the positioning control mechanism includes a bar mirror 201, a laser interferometer 202, and a control device 203. The laser interferometer 202 radiates laser light to the bar mirror 201 and detects light reflected from the bar mirror 201 to measure a distance. The control device 203 controls the stepping motor 113 and the active brake 114 on the basis of the distance obtained by the laser interferometer 202, that is, the current position, to control the position of the X table 103. A voltage that is applied to the piezoelectric element provided in the active brake 114 may be adjusted in order to control the brake force of the active brake 114.

In this embodiment, the position control of the X table 103 has been described. The position control of the Y table 104 is the same as that of the X table. In this embodiment, the bar mirror 201 and the laser interferometer 202 are used to measure the position of the X table 103. However, other position measuring devices may be used.

Figure 4:
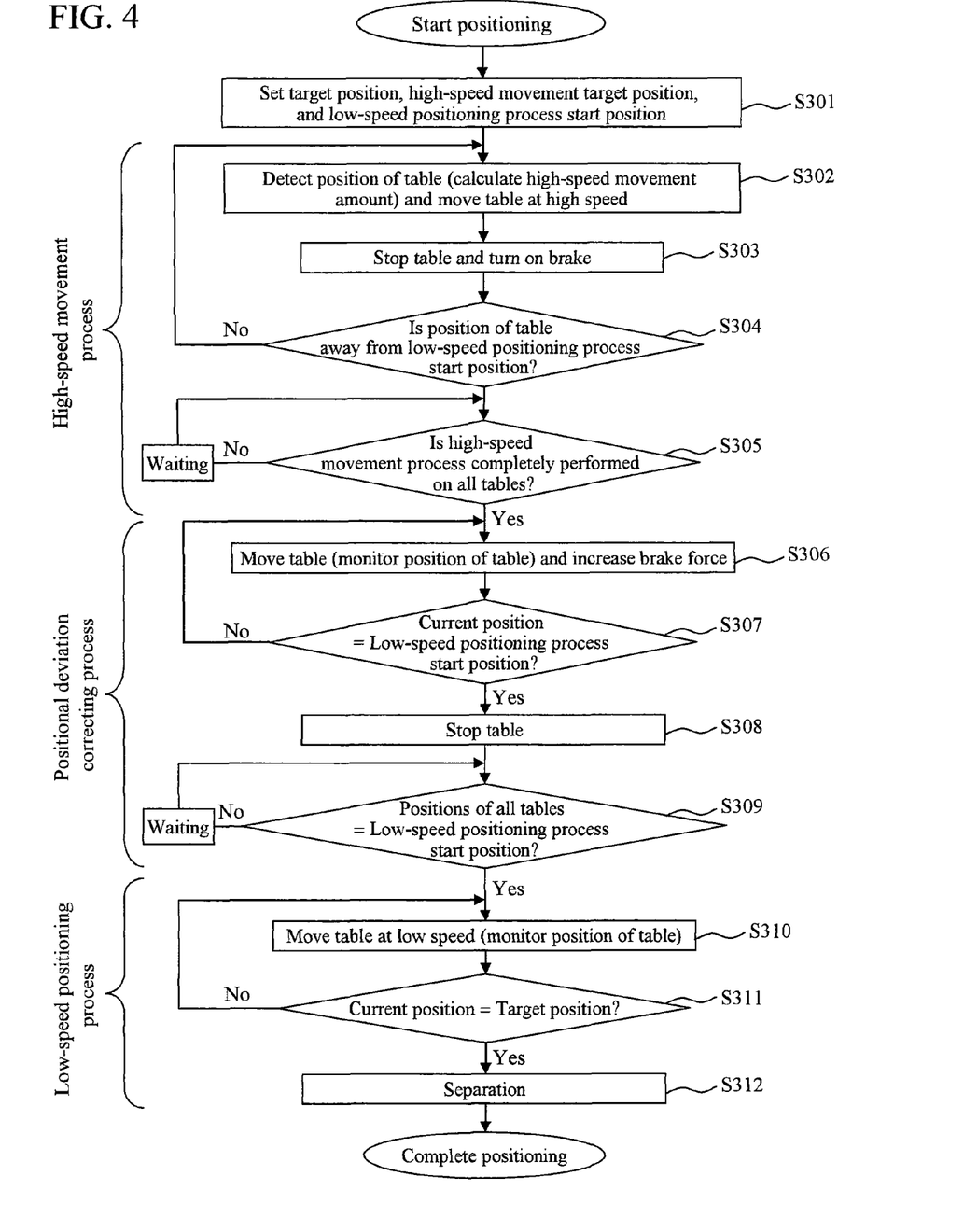
FIG. 4 is a flowchart illustrating an example of a positioning control method of the sample stage apparatus according to the present invention.

An example of a method of controlling the position of the table in the sample stage apparatus according to the present invention will be described with reference to FIG. 4. According to the present invention, three processes, that is, the high-speed movement process, the positional deviation correcting process, and the low-speed positioning process are performed to position the table. In Step S301, a target position, a high-speed movement target position, and a low-speed positioning process start position are set. The target position means the coordinates of the final position of the table. The target position may be registered in advance, or an operator may manually input the target position by designating the target position with a cursor.

The high-speed movement target position means the position of the table by the high-speed movement process, and is disposed a predetermined offset from the target position. The offset of the high-speed movement target position is equal to or greater than the difference between the inside diameter D of the concave portion 121 and the outside diameter d of the pin 111, that is, D−d=50 μm. In this embodiment, the offset of the high-speed movement target position is set to 100 μm in order to prevent the table from being moved by inertial force to reach the target position when the high-speed movement process is completed and the stepping motor 113 stops.

The low-speed positioning process starts at the low-speed positioning process start position. The low-speed positioning process start position is set between the target position and the high-speed movement target position. In this embodiment, the low-speed positioning process start position is set a predetermined offset from the target position. The offset of the low-speed positioning process start position is 30 µm. In the table positioning control according to this embodiment, even when the table is moved along only one axis, the high-speed movement target position and the low-speed positioning process start position are set. Therefore, it is necessary to move both the X table 103 and the Y table 104 all the time.

Steps S302 to S305 correspond to the high-speed movement process. In Step S302, the control device 203 controls the laser interferometer 202 to detect the current position of the sample stage apparatus 101. Then, the control device calculates the distance from the current position to the high-speed movement target position. Then, the control device calculates a movement amount in the high-speed movement process on the basis of the calculated distance. Then, the control device transmits the number of pulses corresponding to the movement amount to the stepping motor 113. In this way, the X table 103 is moved at a high speed. The movement speed of the X table 103 during the high-speed movement process is 250 mm/s.

Then, in Step S303, the stepping motor 113 stops. During the high-speed movement process, the movement speeds of the X and Y tables are relatively high. Therefore, even when the stepping motor 113 stops, the X and Y tables do not stop immediately. As shown in FIG. 2B, the X and Y tables are moved in the range of the gap between the pin 111 and the concave portion 121. The active brake is turned on at the same time as the stepping motor 113 stops. In this case, the brake force is about 15 N and is constant. In this embodiment, the brake force does not reach its maximum value immediately even after the active brake is turned on. The reasons are as two follows: (1) it is necessary to prevent the deformation of the stage when the brake force is rapidly generated; and (2) it is necessary to prevent an increase in the abrasion of a brake part when a load is suddenly applied to the brake part. Therefore, in this embodiment of the present invention, immediately after the high-speed movement process is completed, the active brake is turned on to generate a brake force of 15 N. During the positional deviation correcting process (Steps S306 to S309), the brake force is gradually increased. During the low-speed positioning process, the maximum brake force (30 N) is generated.

Then, in Step S304, the control device 203 controls the laser interferometer 202 to detect the current position of the X table 103. In addition, the control device calculates the deviation between the target position and the current position of the X table 103. Then, the control device determines whether the deviation is equal to or greater than 30 µm. That is, the control device determines whether the X table 103 reaches the low-speed positioning process start position. When the deviation is 30 µm or more, that is, when the X table does not reach the low-speed positioning process start position, the control device ends the high-speed movement process of the X table 103. When the deviation is less than 30 µm, that is, when the X table 103 passes the low-speed positioning process start position, the control device returns the X table 103 to its original position, and performs the high-speed movement process again. When the X table 103 is too close to the target position, it is difficult to perform the next positional deviation correcting process.

Then, in Step S305, the control device determines whether the high-speed movement process is completely performed on the X table 103 and the Y table 104. When it is determined that the high-speed movement process is completely performed on the X table 103 and the Y table 104, the control device proceeds to the positional deviation correcting process.

Steps S306 to S309 correspond to the positional deviation correcting process. In Step S306, the control device 203 moves the X table. During the positional deviation correcting process, the movement speed of the X table is 10 mm/s. During the positional deviation correcting process, the movement speeds of the X and Y tables are relatively low. Therefore, immediately after the stepping motors 113 stop, the X and Y tables stop. In this embodiment, the control device 203 starts to control the laser interferometer 202 to monitor the current position of the X table 103 at the same time as starting to move the X table.

The control device 203 increases the voltage applied to the active brake 114 at the same time as starting to move the X table. That is, the control device increases the brake force. The control device 203 calculates the deviation between the target position and the current position of the X table, and adjusts the voltage applied to the active brake 114 on the basis of the calculated deviation. When the X table reaches the low-speed positioning process start position, the control device increases the brake force to a maximum value. The maximum value of the brake force is 30 N.

Then, in Step S307, the control device 203 measures the current position of the X table, and determines whether the X table reaches the low-speed positioning process start position. When the X table reaches the low-speed positioning process start position, the control device proceeds to Step S308. When the X table does not reach the low-speed positioning process start position, the control device returns to Step S306 to continuously move the X table.

Then, in Step S308, the control device stops the stepping motor 113 to stop the movement of the X table. The movement speed of the X table is sufficiently low, and the brake force is the maximum. Therefore, immediately after the stepping motor 113 stops, the X table stops.

Then, in Step S309, the control device determines whether the positional deviation correcting process is completely performed on the X table 103 and the Y table 104. When the positional deviation correcting process is completely performed on the X table 103 and the Y table 104, the control device proceeds to the low-speed positioning process.

Steps S310 and S311 correspond to the low-speed positioning process. In Step S310, the control device 203 moves the X table 103 and the Y table 104. The movement speeds of the both tables are 1 mm/s. The control device 203 starts to control the laser interferometer 202 to monitor the current position of the X table 103 at the same time as starting to move the X table.

According to this embodiment, the movement start time of the X table 103 and the Y table 104 is set such that the X table 103 and the Y table 104 simultaneously reach the target position. The control device 203 measures the current positions of the X table 103 and the Y table 104, and calculates the deviations between the target position and the current positions. The control device sets the movement start time of the X table 103 and the Y table 104 on the basis of the calculated deviations.

Then, in Step S311, the control device 203 measures the current positions of the X table 103 and the Y table 104, and determines whether the X table 103 and the Y table 104 reach the target position. When the X table 103 and the Y table 104 reach the target position, the control device stops the stepping motor 113. When the X table 103 and the Y table 104 do not reach the target position, the control device returns to Step S310 to continuously move the X table 103 and the Y table 104.

During the low-speed positioning process, the movement speeds of the X and Y tables are sufficiently low, and the maximum brake force is obtained. Therefore, immediately after the stepping motors 113 stop, the X and Y tables stop.

Then, in Step S312, the ball screws 107 and 109 arranged in the X and Y directions are moved in the directions that are opposite to the movement directions of the X and Y tables, respectively. Then, as shown in FIG. 2C, the pins 111 of the X rod 108 and the Y rod 110 are separated from the inner surfaces of the concave portions 121 of the X table 103 and the Y table 104, respectively. In this way, positioning is completed.

Figure 5:
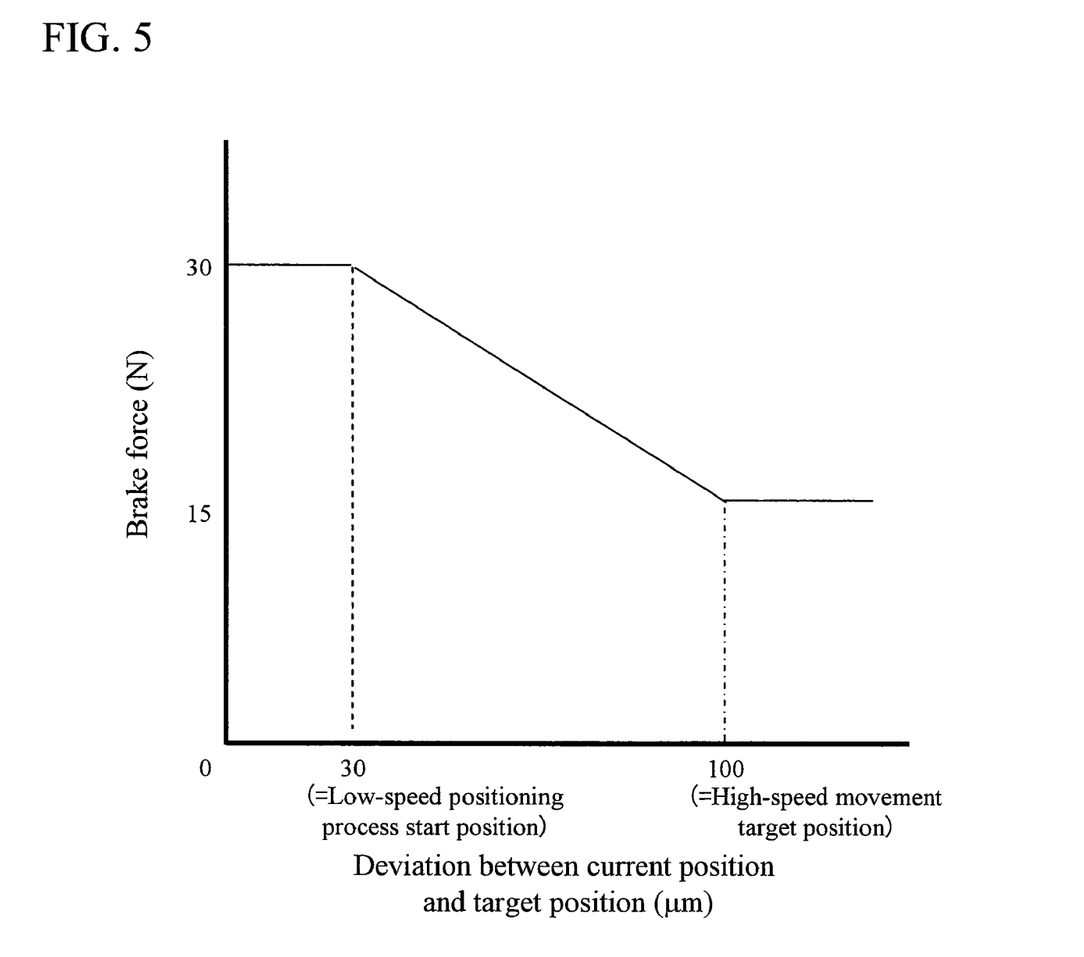
FIG. 5 is a diagram illustrating the relationship between brake force and the deviation between a target position and a current position in the positioning control method of the sample stage apparatus according to the present invention.

Next, the brake force generated by the active brake 114 in the method of controlling the position of the table according to the present invention will be described with reference to FIG. 5. In a graph shown in FIG. 5, the horizontal axis indicates the deviation between the target position and the current position of each table, and the vertical axis indicates the brake force. In the final step of the high-speed movement process, when the stepping motor 113 stops and the active brake is turned on, a brake force of 15 N is obtained. Then, during the positional deviation correcting process, the control device increases the brake force while moving the table. When the positional deviation correcting process starts, the brake force is 15 N. However, when the positional deviation correcting process ends, the brake force is 30 N, that is, the maximum value. During the final low-speed positioning process, the brake force is 30 N.

Although the embodiment of the present invention has been described above, the present invention is not limited to the embodiment. It will be understood by those skilled in the art that various modifications and changes of the present invention can be made without departing from the scope of the present invention described in the appended claims.

Description of the Reference Numerals

101: sample stage apparatus
102: base
103: X table
104: Y table
105: X-direction guide mechanism
106: Y-direction guide mechanism
107: X ball screw
108: X rod
109: Y ball screw
110: Y rod
111: pin
112: gap
113: stepping motor
114: active brake
115: sample holder
116: sample wafer
120: connection portion
121: concave portion
201: bar mirror
202: laser interferometer
203: control device

What is claimed is:

1. A positioning control method of a sample stage apparatus including a plurality of tables with different axes, rods that drive each of the tables, and connection portions that connect the tables to the rods and include concave portions and pins inserted into the concave portions, the method comprising:

a high-speed movement step of moving one of the plurality of tables with different axes to a predetermined high-speed movement target position at a first movement speed;

a positional deviation correcting step of moving the table to a predetermined low-speed positioning step start position at a second movement speed that is lower than the first movement speed after the high-speed movement step;

a low-speed positioning step of moving the table to a predetermined target position at a third movement speed that is lower than the second movement speed after the positional deviation correcting step; and a step of returning the rod to separate the pin from the concave portion after the low-speed positioning step.

2. The positioning control method of the sample stage apparatus according to claim 1, wherein the positional deviation correcting step starts after the high-speed movement step is completely performed on all the tables with different axes, and the low-speed positioning step starts after the positional deviation correcting step is completely performed on all the tables with different axes.

3. The positioning control method of the sample stage apparatus according to claim 1, wherein the high-speed movement step includes the sub-steps of:

detecting the position of the table after the table stops; and comparing the position of the table with the predetermined high-speed movement target position, when a deviation between the position of the table and the high-speed movement target position is less than a predetermined value, the high-speed movement step is performed again from the beginning.

4. The positioning control method of the sample stage apparatus according to claim 1, wherein the high-speed movement target position is disposed a predetermined offset from the target position, and the offset is 100 μm.

5. The positioning control method of the sample stage apparatus according to claim 1, wherein the high-speed movement target position is disposed a predetermined offset from the target position, and the offset is equal to or greater than a difference, D−d, between an inside diameter D of the concave portion and an outside diameter d of the pin.

6. The positioning control method of the sample stage apparatus according to claim 1, wherein the high-speed movement step includes the sub-steps of:

detecting the current position of the table;

calculating a distance from the current position to the high-speed movement target position;

calculating a movement amount in the high-speed movement step on the basis of the calculated distance; and operating a motor that drives the table, on the basis of the movement amount.

7. The positioning control method of the sample stage apparatus according to claim 1, wherein, in the high-speed movement step, when the motor that drives the table stops, the driving of a brake that brakes the movement of the table starts.

8. The positioning control method of the sample stage apparatus according to claim 1, wherein, in the positional deviation correcting step, when the motor that drives the table is operated, the brake force of the brake that stops the movement of the table starts to increase and the brake force increases until the positional deviation correcting step is completed.

9. The positioning control method of the sample stage apparatus according to claim 1,
wherein the low-speed positioning step start position is disposed a predetermined offset from the target position, and
the offset is 30 μm.

10. The positioning control method of the sample stage apparatus according to claim 1,
wherein, in the positional deviation correcting step, when the motor that drives the table is operated, the monitoring of the position of the table starts, and
when the table reaches the low-speed positioning step start position, the motor that drives the table stops.

11. The positioning control method of the sample stage apparatus according to claim 1,
wherein the low-speed positioning step is started on each of the tables with different axes such that the low-speed positioning step performed on all the tables is completed at the same time.

12. The positioning control method of the sample stage apparatus according to claim 1,
wherein, in the low-speed positioning step, the final brake force of the positional deviation correcting step is maintained.

13. A sample stage apparatus comprising:
an X table that can be moved in an X direction;
an X rod that is connected to the X table;
a connection portion that connects the X table to the X rod;
an X motor that drives the X rod;
an X brake that controls the movement of the X table;
a Y table that can be moved in a Y direction;
a Y rod that is connected to the Y table;
a connection portion that connects the Y table to the Y rod;
a Y motor that drives the Y rod;
a Y brake that controls the movement of the Y table; and
a sample holder that is provided on the Y table,
wherein each of the connection portions includes a concave portion provided in the table and a pin provided in the rod,
the pin is inserted into the concave portion to connect the table to the rod, and
the positions of the tables are determined by a high-speed movement step of moving the X table and the Y table to a predetermined high-speed movement target position at a first movement speed, a positional deviation correcting step of moving the X table and the Y table to a predetermined low-speed positioning step start position at a second movement speed that is lower than the first movement speed, a low-speed positioning step of moving the X table and the Y table to a predetermined target position at a third movement speed that is lower than the second movement speed, and a step of returning the rods after the low-speed positioning step is completed to separate the pins from the concave portions.

14. The sample stage apparatus according to claim 13,
wherein the positional deviation correcting step starts after the high-speed movement step is completely performed on the X table and the Y table, and
the low-speed positioning step starts after the positional deviation correcting step is completely performed on the X table and the Y table.

15. The sample stage apparatus according to claim 13, further comprising:
a position detecting device that detects the positions of the tables,
wherein in the positional deviation correcting step, the motors stop on the basis of the positions of the tables detected by the position detecting device.

16. The sample stage apparatus according to claim 13,
wherein the X motor and the Y motor are stepping motors.

17. The sample stage apparatus according to claim 13,
wherein the X brake and the Y brake are active brakes that include piezoelectric elements, and the brake forces of the active brakes can be controlled by adjusting a voltage applied to the piezoelectric elements.

* * * * *